US012610491B2

(12) United States Patent　　　　　　(10) Patent No.:　US 12,610,491 B2

Marrs et al.　　　　　　　　　　　　　　(45) Date of Patent:　Apr. 21, 2026

(54) SYSTEMS AND METHODS FOR MOUNTING INFORMATION HANDLING SYSTEMS TO SERVER RACKS USING A SPACER

(71) Applicant: Dell Products, L.P., Round Rock, TX (US)

(72) Inventors: Travis Marrs, Austin, TX (US); Karl Hamand, Georgetown, TX (US)

(73) Assignee: Dell Products L.P., Round Rock, TX (US)

( * ) Notice:　Subject to any disclaimer, the term of this patent is extended or adjusted under 35 U.S.C. 154(b) by 317 days.

(21) Appl. No.: 18/352,355

(22) Filed:　Jul. 14, 2023

(65)　　　　Prior Publication Data

US 2025/0024624 A1　　Jan. 16, 2025

(51) Int. Cl.
　　*H05K 7/14*　　　　　(2006.01)
(52) U.S. Cl.
　　CPC ........... *H05K 7/142* (2013.01); *H05K 7/1407* (2013.01)
(58) Field of Classification Search
　　CPC ............................. H05K 7/142; H05K 7/1407
　　USPC ..................................................... 361/679.01
　　See application file for complete search history.

(56)　　　　　　References Cited

U.S. PATENT DOCUMENTS

| | | | | |
|---|---|---|---|---|
| 11,800,693 | B1 * | 10/2023 | Sampath ............ | H05K 7/20736 |
| 2002/0195408 | A1 * | 12/2002 | Hegrenes ............... | H05K 7/183 |
| | | | | 312/265.4 |
| 2014/0086665 | A1 * | 3/2014 | Baik .................... | H05K 7/1489 |
| | | | | 403/13 |
| 2016/0234960 | A1 * | 8/2016 | Masuyama .......... | H05K 7/1498 |
| 2021/0084789 | A1 * | 3/2021 | Kuo ........................ | H05K 7/183 |

* cited by examiner

*Primary Examiner* — Zhengfu J Feng
(74) *Attorney, Agent, or Firm* — Fogarty LLP

(57)　　　　　　ABSTRACT

Systems and methods for mounting Information Handling Systems (IHSs) to server racks using a spacer are described. In some illustrative non-limiting embodiments, a server rack assembly may include: a left-side mounting post; a right-side mounting post; a left-side rail on the left-side of the server rack; a right-side rail on the right-side of the server rack; a left-side spacer removably coupled to both a front of the left-side rail, and to the left-side mounting post; and a right-side spacer removably coupled to both a front of the right-side rail, and to the right-side mounting post. In other non-limiting embodiments, a spacer assembly includes a mounting flange configured to removably couple to a rail of a server rack; and a connector configured to couple to a mounting post of the server rack. Some embodiments further include an elongated server ear configured to couple to an IHS and to the mounting post.

15 Claims, 13 Drawing Sheets

700

710

712

712

700

SYSTEMS AND METHODS FOR MOUNTING INFORMATION HANDLING SYSTEMS TO SERVER RACKS USING A SPACER

FIELD

This disclosure relates generally to Information Handling Systems (IHSs), and more specifically, to systems and methods for mounting IHSs to server racks using a spacer.

BACKGROUND

As the value and use of information continues to increase, individuals and businesses seek additional ways to process and store information. One option available to users is Information Handling Systems (IHSs). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Nowadays, users can choose among many different types of IHS devices. Each type of device (e.g., tablets, 2-in-1s, mobile workstations, notebooks, netbooks, ultra-books, etc.) has unique portability, performance, and usability features; however, each also has its own trade-offs and limitations. For example, tablets have less compute power than notebooks and workstations, while notebooks and workstations lack the portability of tablets. A conventional 2-in-1 device combines the portability of a tablet with the performance of a notebook, but with a small display—an uncomfortable form factor in many use-cases.

Groups of IHSs can be housed in server racks of data centers. A data center is a building, a dedicated space within a building, or a group of buildings used to house computer systems and associated components, such as telecommunications and storage systems. Since IT operations are crucial for business continuity, it generally includes redundant or backup components and infrastructure for power supply, data communication connections, environmental controls (e.g., air conditioning, fire suppression), and various security devices. A large data center is an industrial-scale operation using as much electricity as a small town. A server rack, or simply "rack", is a frame or enclosure, with one or more dimensions typically standardized, for mounting multiple electronic equipment modules. Each module has a front panel that typically has a standardized width, which sometimes is 19 inches wide, for example. The standardized width (e.g., 19-inches) dimension includes the edges or ears that protrude from each side of the equipment, allowing the module to be fastened to the rack frame with screws or bolts. Common uses include computer servers, telecommunications equipment and networking hardware, audiovisual production gear, music production equipment, and scientific equipment.

SUMMARY

Systems and methods for mounting IHSs to server racks using a spacer are described. In an illustrative, non-limiting embodiment, a spacer assembly includes: a mounting flange configured to removably couple to a rail of a server rack; and a connector configured to couple to a mounting post of the server rack.

In some embodiments, the spacer assembly further includes: an elongated server ear configured to couple to an Information Handling System (IHS), where the elongated server ear includes a flange configured to couple to the connector of the spacer assembly and the mounting post of server rack. In some embodiments, the IHS is a server system. In some of these embodiments, the server system includes a front-accessed reverse-airflow (RAF) chassis.

In some embodiments, the connector is further configured couple to the mounting post of the server rack using one or more screws. In some of these embodiments, the connector is further configured to couple to the elongated server ear using the one or more screws to fully secure the IHS in the rack. In some embodiments, the spacer assembly mounts the rail of the server rack further back into the server rack. In some embodiments, the mounting post is a front-side mounting post of the server rack, and where the rail is further coupled to a back-side mounting post of the server rack.

In another illustrative, non-limiting embodiment, a method, includes: coupling a spacer assembly to a rail of a server rack; and coupling the spacer assembly to a mounting post of the server rack.

In some embodiments, the method further includes: coupling one or more elongated server ears to an IHS; and sliding the IHS into the rail of the server rack. In some embodiments, prior to coupling the one or more elongated server ears to the IHS, the method further includes: removing one or more original server ears from the IHS, where the original server ears are shorter than the elongated server ear. In some embodiments, the method further includes: coupling the elongated server ears to the mounting post of the server rack and to the spacer assembly. In some embodiments, the IHS is a server system.

In some embodiments, coupling the spacer assembly to the rail of the server rack further includes: pushing a front face plate of the rail aside; seating the spacer assembly onto the rail; closing the front fact plate of the rail; and capturing the spacer assembly by the closing of the front face plate of the rail. In some embodiments, the spacer assembly is coupled to the mounting post of the server rack using one or more screws. In some embodiments, the spacer assembly is coupled to a front-side mounting post of the server rack, and the method further includes: coupling a back of the rail to a back-side mounting post of the server rack.

In another illustrative, non-limiting embodiment, a server rack includes: a front left-side mounting post; a front right-side mounting post; a left-side rail on the left-side of the server rack; a right-side rail on the right-side of the server rack; a left-side spacer removably coupled to both a front of the left-side rail, and to the left-side mounting post; and a right-side spacer removably coupled to both a front of the right-side rail, and to the right-side mounting post.

In some embodiments, the server rack further includes: a server system, including a left-side server ear and a right-side server ear, coupled to the left-side rail and the right-side rail; a first connector to couple the left-side server ear to the left-side mounting post and the left-side spacer; and a second connector to couple the right-side server ear to the right-side mounting post and the right-side spacer. In some embodiments, the server system includes a front-accessed reverse-airflow (RAF) chassis, where the first connector and the second connector include screws. In some embodiments, the server rack further includes: a back left-side mounting post, where the left-side rail is further coupled to the back left-side mounting post; and a back right-side mounting post, where the right-side rail is further coupled to the back right-side mounting post.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

Figure 1:
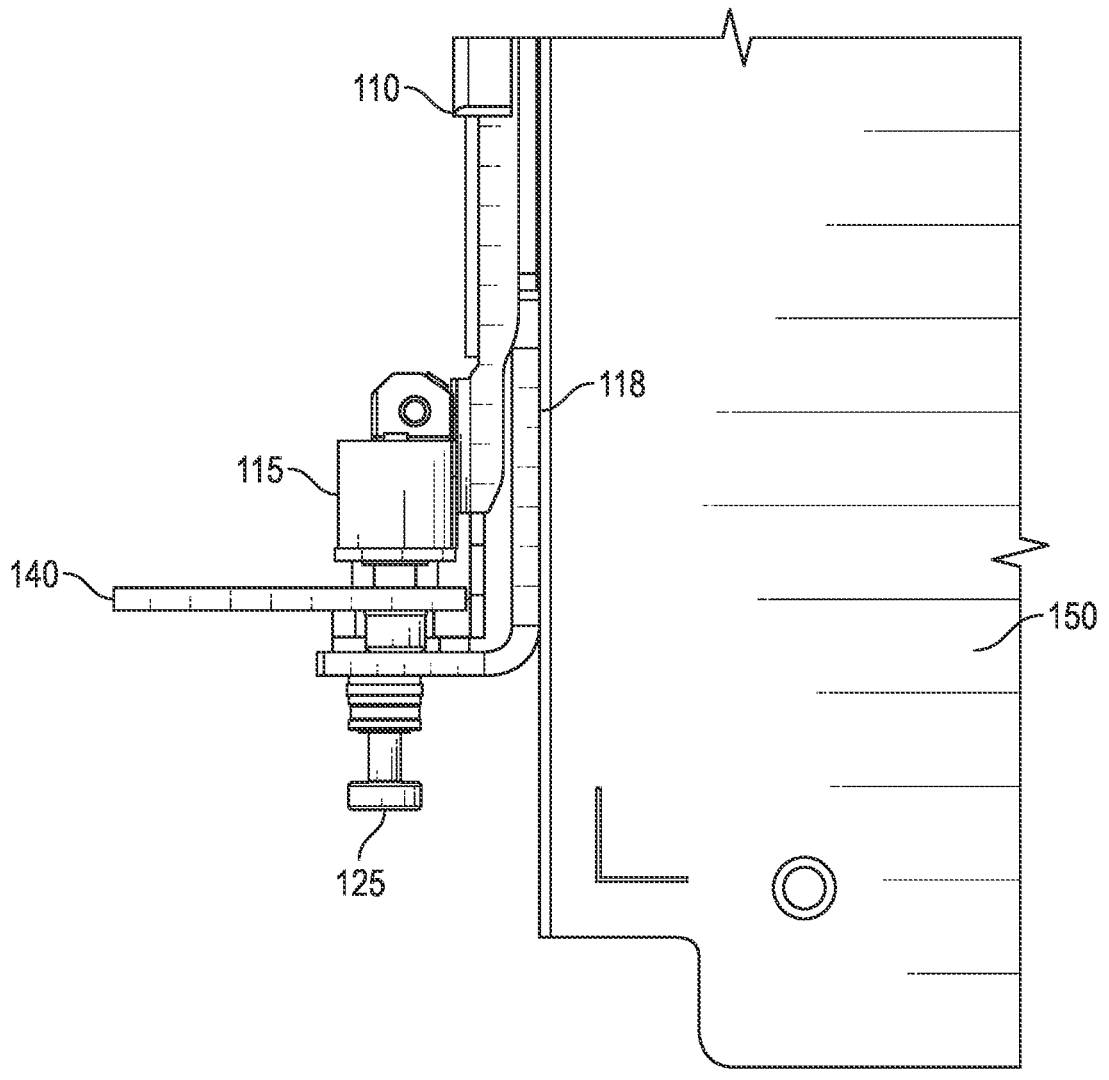
FIG. 1 (Prior Art) is a top perspective view of a prior art configuration of an IHS mounted to a server rack, shown from the top looking down and focusing on the left rack mounting point, where the IHS protrudes from the rack.

Embodiments described herein provide systems and methods for mounting IHSs to server racks using a spacer. Equipment designed to be placed in a rack is typically described as rack-mount, rack-mount instrument, a rack-mounted system, a rack-mount chassis, subrack, rack cabinet, rack-mountable, or occasionally simply shelf. Each equipment module has a front panel that is typically a standardized width, (e.g., 19 inches wide). The standardized width can include the edges or cars that protrude from each side of the equipment, allowing the module to be fastened to the rack frame with screws or bolts. The height of the electronic modules is also typically standardized as multiples of 1.75 inches, which is one rack unit ("RU" or more typically just "U"). The industry-standard rack cabinet is 42 RU tall, however, 45 RU racks are also common.

Racks (e.g., nineteen-inch racks) in two-post or four-post form hold most equipment in modern data centers, ISP facilities, and professionally designed corporate server rooms. They allow for dense hardware configurations without occupying excessive floor space or requiring shelving. Racks can also be used to house professional audio and video equipment, including amplifiers, effects units, interfaces, headphone amplifiers, and even small-scale audio mixers. A third common use for rack-mounted equipment is industrial power, control, and automation hardware.

Rack-mountable equipment can be mounted by bolting or clipping its front panel to the server rack. Within the IT industry, it is common for network/communications equipment to have multiple mounting positions, including table-top and wall mounting, so rack-mountable equipment will often feature L-brackets that must be screwed or bolted to the equipment prior to mounting in a server rack, such as for example, a 19-inch rack.

A key structural weakness of front-mounted support is the bending stress placed on the mounting brackets of the equipment, and the rack itself. As a result, some embodiments of the present disclosure employ 4-post racks, featuring a mirrored pair of rear mounting posts. Four-post racks allow for mounting rails to support the equipment at the front and rear. These racks may be open in construction without sides or doors or may be enclosed by front and/or rear doors, side panels, and/or tops. Data centers can use four-post racks. Since the spacing between the front and rear mounting posts may differ between rack vendors and/or the configuration of the rack, some equipment that feature 4-post mounting brackets can have an adjustable rear bracket. Servers and deep pieces of equipment can be mounted using rails that are bolted to the front and rear posts. In some embodiments, such rails can have an adjustable depth, allowing the equipment to be supported by four posts, while also enabling it to be easily installed and removed.

Although there is no standard for the depth of equipment, nor specifying the outer width and depth of the rack enclosure itself (incorporating the structure, doors and panels that contain the mounting rails), there is a tendency for 4-post racks to be 600 mm (23.62 in) or 800 mm (31.50 in) wide, and for them to be 600 mm (23.62 in), 800 mm (31.50 in) or 1,010 mm (39.76 in) deep. This of course varies by manufacturer, the design of the rack and its purpose, but through common constraining factors (such as raised floor tile dimensions), these dimensions have become quite common. The extra width and depth enables cabling to be routed with ease (also helping to maintain bend-radius for fiber and copper cables) and deeper equipment to be utilized. A common feature in IT racks are mounting positions for Zero-U accessories, such as power distribution units ("PDUs") and vertical cable managers/ducts, that utilize the space between the rear rails and the side of the rack enclosure.

The strength required of the mounting posts means they are invariably not merely flat strips but actually a wider folded strip arranged around the corner of the rack. The posts are usually made of steel of around 2 mm thickness (the official standard recommends a minimum of 1.9 mm), or of slightly thicker aluminum.

Racks, especially two-post racks, are often secured to the floor or adjacent building structure so as not to fall over. This is usually required by local building codes in seismic zones. According to Telcordia Technologies Generic Requirements document GR-63-CORE, during an earthquake, telecommunications equipment is subjected to motions that can over-stress equipment framework, circuit boards, and connectors. The amount of motion and resulting stress depends on the structural characteristics of the building and framework in which the equipment is contained and the severity of the earthquake. Seismic racks rated according to GR-63, NEBS Requirements: Physical Protection, are available, with Zone 4 representing the most demanding environment. GR-3108, Generic Requirements for Network Equipment in the Outside Plant ("OSP"), specifies the usable opening of seismic-compliant 19-inch racks.

Heavy equipment or equipment which is commonly accessed for servicing, for which attaching or detaching at all four corners simultaneously would pose a problem, may not be mounted directly onto the rack, but instead can be mounted via rails (or slides). A pair of rails can be mounted directly onto the rack, and the equipment can then slide into the rack along the rails, which support it. When in place, the equipment may also then be bolted to the rack. The rails may also be able to fully support the equipment in a position where it has been slid clear of the rack; this is useful for inspection or maintenance of equipment which will then be slid back into the rack. Some rack slides can include a tilt mechanism allowing easy access to the top or bottom of rack-mounted equipment when it is fully extended from the rack.

Slides or rails for computers and other data processing equipment such as disk arrays or routers often need to be purchased directly from the equipment manufacturer, as there is no standardization on such equipment's thickness (measurement from the side of the rack to the equipment) or means for mounting to the rail. A rails kit may include a cable management arm ("CMA"), which folds the cables attached to the server and allows them to expand neatly when the server is slid out, without being disconnected.

Computer servers designed for rack-mounting can include a number of extra features to make the server easy to use in the rack. The sliding rails can lock in various extended positions to prevent the equipment from moving when extended out from the rack for service. The server itself might have locking pins on the sides that just drop into slots on the extended rail assembly, in a manner similar to a removable kitchen drawer. This permits very easy server installation and removal since there is no need for the server to be held in midair while someone fastens each rail to the sides of the server with screws.

Some manufacturers of rack-mount hardware include a folding cable tray behind the server, so that the cables are held into a neat and tidy folded channel when inside the rack, but can unfold out into a long strip when pulled out of the rack, allowing the server to continue to be plugged in and operating normally even while fully extended and hanging in mid-air in front of the rack. This piece of equipment thus simplifies maintenance but at the cost of providing a restriction to airflow.

Rack-optimized servers might duplicate indicator lights on the front and rear of the rack to help identify a machine needing attention or provide separate identify LED indicators on both sides of the server (which can be turned on in software or by pushing an associated button). Since some configurations permit over fifty 1 RU servers in a single rack, this provides a simple method to determine exactly which machine is having a problem when at the rear of the rack. A handle may be provided at the rear of the server rails, to help pull or push the server without having to pull on the cables. When there is a large number of computers in a single rack, it is impractical for each one to have its own separate keyboard, mouse, and monitor. Instead, a KVM switch or LOM software is used to share a single keyboard/video/mouse set amongst many different computers.

Since the mounting hole arrangement is vertically symmetric, it is possible to mount rack-mountable equipment upside-down. However, not all equipment is suitable for this type of mounting. For instance, most optical disc players will not work upside-down because the driving motor mechanism does not grip the disc.

Originally, the mounting holes were tapped with a particular screw thread. When rack rails are too thin to tap, riv-nuts or other threaded inserts can be used, and when the particular class of equipment to be mounted is known in advance, some of the holes can be omitted from the mounting rails. Threaded mounting holes in racks where the equipment is frequently changed are problematic because the threads can be damaged, or the mounting screws can break off. Both problems render the mounting hole unusable. Tapping large numbers of holes that may never be used is expensive. Nonetheless, tapped-hole racks are still in use, generally for hardware that rarely changes. Examples include telephone exchanges, network cabling panels, broadcast studios and some government and military applications.

Because of these problems, the tapped-hole rack can be replaced by clearance-hole (Round Hole, Round Unthreaded Holes, and Versa Rail) racks. The holes are large enough to permit a bolt to be freely inserted through without binding, and bolts are fastened in place using cage nuts. In the event of a nut being stripped out or a bolt breaking, the nut can be easily removed and replaced with a new one. Production of clearance-hole racks is less expensive because tapping the holes is eliminated and replaced with fewer, less expensive, cage nuts.

Square-hole racks can allow boltless mounting, such that the rack-mount equipment only needs to insert through and hook down into the lip of the square hole. Installation and removal of hardware in a square hole rack is very easy and boltless, where the weight of the equipment and small retention clips are all that is necessary to hold the equipment in place. Older equipment meant for round-hole or tapped-hole racks can still be used, with the use of cage nuts made for square-hole racks.

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components.

FIG. 1 (Prior Art) is a top perspective view of a prior art configuration of an IHS mounted to a server rack, shown from the top looking down and focusing on the left rack mounting point. As depicted in FIG. 1, the IHS (in this case the server system) protrudes from the rack. When originally installed, some server systems 150 can protrude from the front of the rack, which can create rack door interference and cable management issues. In FIG. 1, the front of the rack is depicted by the left front mounting post 140, of the left front rack mounting point. The server system 150 protrudes way beyond this front of the rack, depicted in FIG. 1 by extending further down the printed page than the front of the rack. In FIG. 1, the further down the printed page represents the further to the front of the rack, and the further up the printed page represents the further to the back of the rack.

Also depicted by FIG. 1, a rack rail 110 is secured to the left front mounting post 140 by a rail connection component 115 that connects the rack rail 110 to the front of the rack. A prior art server ear 118 is connected to the server system 150 by screws. The server system can be positioned on the rack rails 110, and then slid into the rack on the rack rails 110. Once the server system 150 is slid into the rack, the prior art server ear 118 can then connected to the front of the rack by sever-ear to front of rack connection mechanism 125 to lock the server system 150 in place within the rack.

Figure 2:
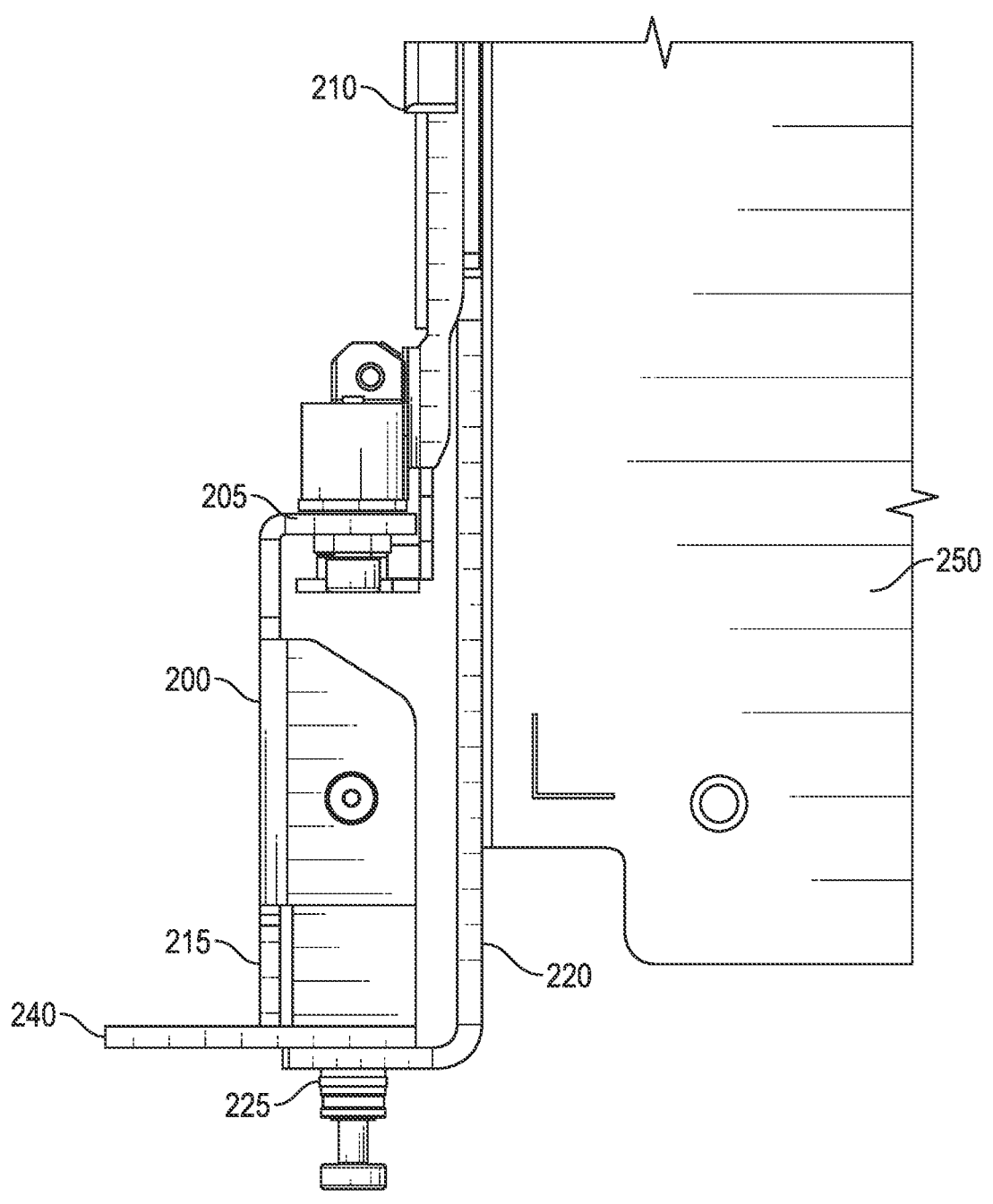
FIG. 2 is a top perspective view of the IHS mounted to the server rack using a spacer solution and updated server ear, focusing on the left rack mounting point, with the IHS moved further back in the rack, negating possible rack door interference and cable management issues, according to some embodiments.

FIG. 2 is a top perspective view of the IHS (in this case server system 250) mounted to a server rack using a new spacer solution 200 and an updated server ear 220, focusing on the left rack mounting point, with the IHS 250 moved further back in the rack, negating possible rack door interference and cable management issues, according to some embodiments. With the new spacer 200 and server ear 220 system, a new flange location inside the rack has been created, allowing the server system 250 to be moved further in the rack, negating possible rack door interference and cable management issues. The new spacer 200 and server ear 220 system can provide better cable management capabilities, better cable routing possibilities by the user, and less of a chance for rack door interference with the server system 250. In FIG. 2, the front of the rack is depicted by the left-side front mounting post 240, of the left-side front rack mounting point. The server system 250 does not protrude beyond this front of the rack, depicted in FIG. 2 by not extending further down the printed page than the front of the rack. In FIG. 2, the further down the printed page represents the further to the front of the rack, and the further up the printed page represents the further to the back of the rack.

Also depicted by FIG. 2, a rack rail 210 is secured to the new spacer 200 by a new mount flange 205. The new spacer 200 is connected to the left front mounting post 240 by a spacer to rack rail connection component 215 that connects the spacer 200 to the front of the rack. A new elongated server ear 220 is connected to the server system 250 by screws. The server system can be positioned on the rack rails 210, and then slid into the rack on the rack rails 210. Once the server system 250 is slid into the rack, the new elongated server ear 220 can then be connected to the front of the rack by sever-ear to front of rack connection mechanism 225 to lock the server system 250 in place within the rack.

The new spacer solution 200 and an updated server ear 220 can be used for narrow racks, in some embodiments, that require a server system to be moved back in the rack. This can allow for better cable management capabilities, better cable routing possibilities by the user, and less chance for rack door interference with the server system 250. In some embodiments, the server system 250 is moved from its original position back 55.5 mm into the rack. The new spacer 200 can allow the server rails to 'lock' into it. The new spacer 200 can be attached to the mounting post 240 of the rack using M4 screws, in some embodiments. The new spacer 200, working in conjunction with elongated server ear 220 can fully secure the server system 250 to the rack. In some embodiments, the server system 250 includes a front-accessed reverse-airflow (RAF) chassis.

Figure 3:
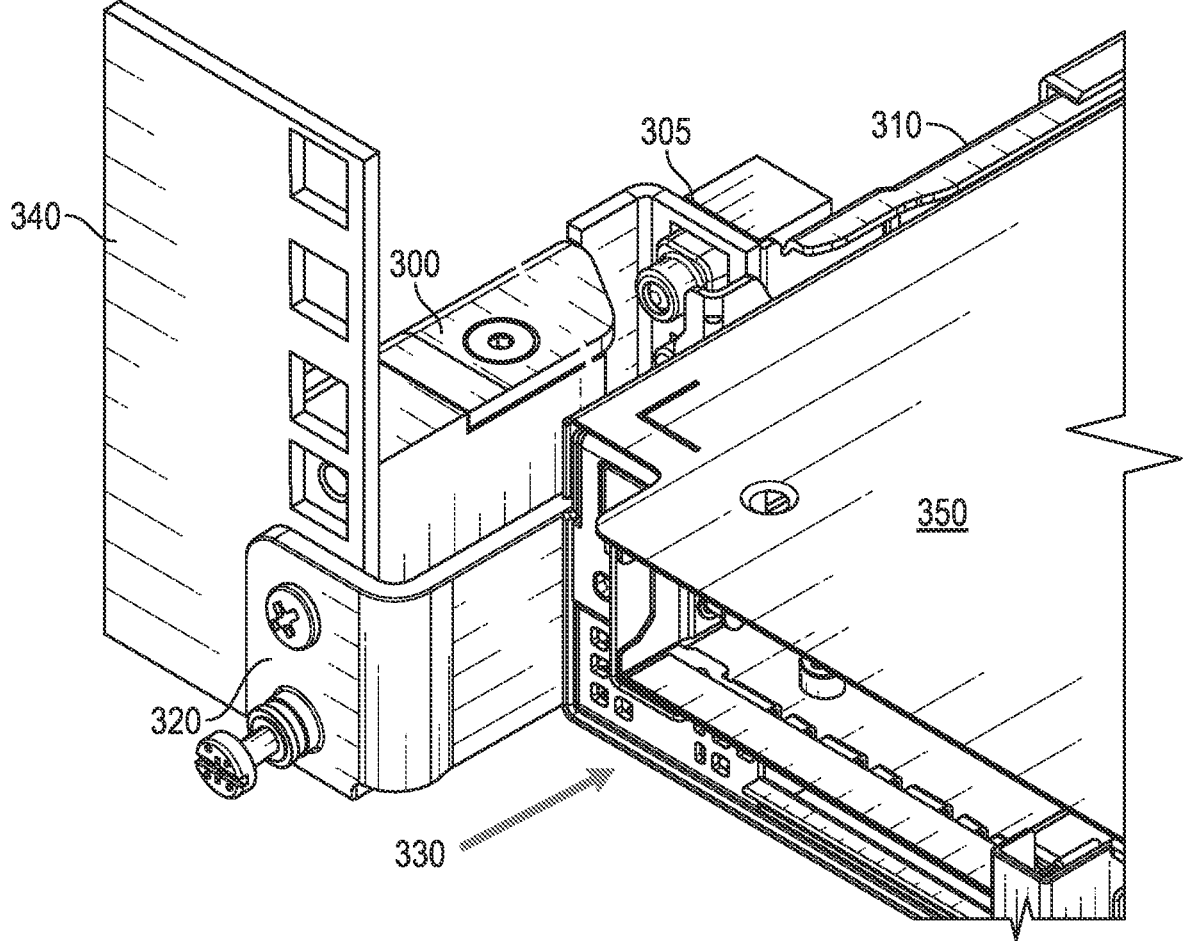
FIG. 3 is an angled top and side perspective view of the IHS mounted to the server rack using a spacer solution and updated server ear that pushes the IHS further back in the rack, focusing on the left rack mounting point, according to some embodiments.

FIG. 3 is an angled top and side perspective view of the IHS (in this case server system 350) mounted to the server rack using a spacer solution 300 and an updated server ear 320 that pushes the IHS further back in the rack (shown by arrow 330), focusing on the left rack mounting point, according to some embodiments. The new spacer 300 and new server ear 320 can be provided on the right rack mounting point as well, sometimes in a mirrored capacity. This can negate possible rack door interference and cable management issues, according to some embodiments. With the new spacer 300 and server ear 320 system, the server system 350 to be moved further in the rack 330, negating possible rack door interference and cable management issues. In FIG. 2, the front of the rack is depicted by the left front mounting post 340, of the left front rack mounting point. The server system 350 does not protrude beyond this front of the rack.

Also depicted by FIG. 3, a rack rail 310 is secured to the new spacer 300 by a new mount flange 305. The new spacer 300 is connected to the left front mounting post 340, which in this depiction is the front of the rack. A new elongated server ear 320 is connected to the server system 350 by screws. The server system can be positioned on the rack rails 310, and then slid into the rack on the rack rails 310. Once the server system 350 is slid into the rack, the new elongated server ear 320 can then be connected to the front of the rack to lock the server system 350 in place within the rack.

Figure 4:
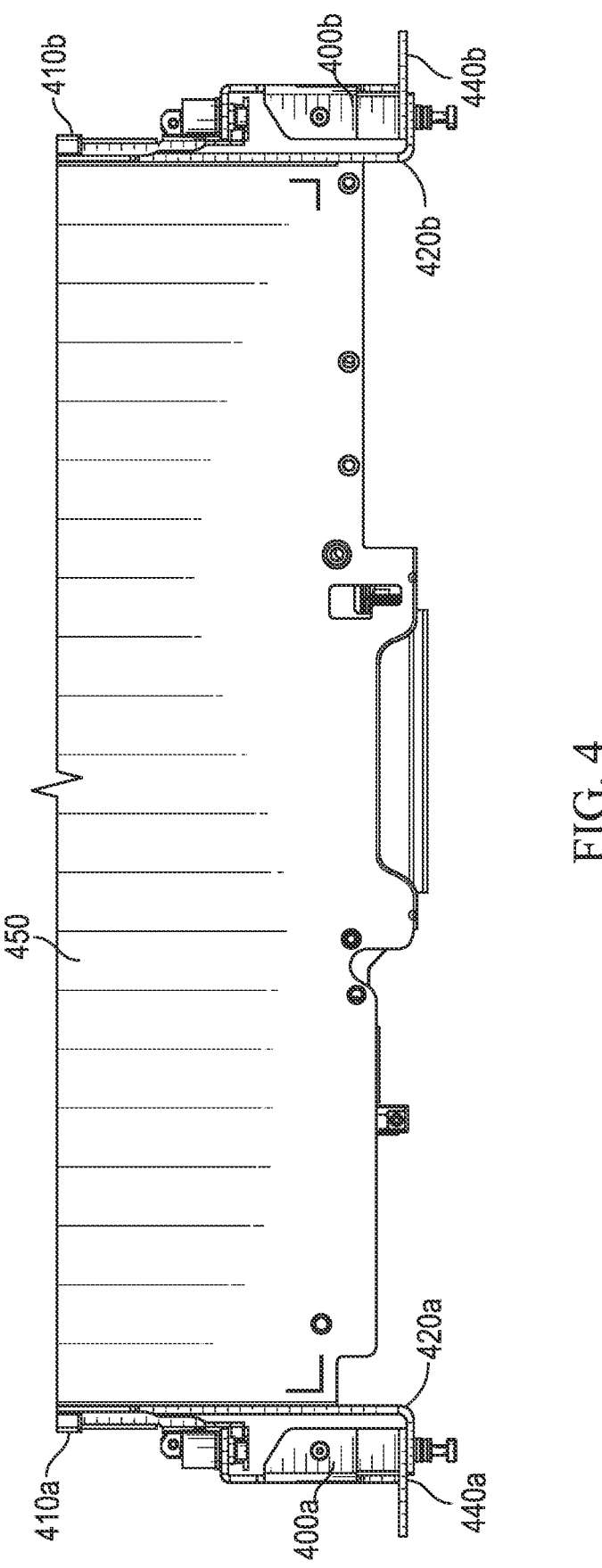
FIG. 4 is a top perspective view of the full width of an IHS mounted to the server rack using a spacer solution and updated server ear, showing both the left-front and right-front mounting points, with the IHS moved further back in the rack, negating possible rack door interference and cable management issues, according to some embodiments.

FIG. 4 is a top perspective view of the full width of an IHS (in this case server system 450) mounted to the server rack using a spacer solution (400a, 400b) and updated server ear (420a, 420b), showing both the left-front and right-front mounting points, with the IHS moved further back in the rack, negating possible rack door interference and cable management issues, according to some embodiments. As depicted by FIG. 4, a left rack rail 410a is secured to the new left-side spacer 400a, and a right rack rail 410b is secured to the new right-side spacer 400b. The new left-side spacer 400a is connected to the left front mounting post 440a. The new right-side spacer 400b is connected to the right front mounting post 440b. A new left-side elongated server ear 420a is connected to the server system 450 by screws. A new right-side elongated server ear 420b is also connected to the server system 450 by screws. The server system can be positioned on the rack rails (410a, 410b), and then slid into the rack on the rack rails. Once the server system 450 is slid into the rack, the new elongated server ears (420a, 420b) can then be connected to the mounting posts (440a, 440b) at the front of the rack to lock the server system 450 in place within the rack.

Figure 5:
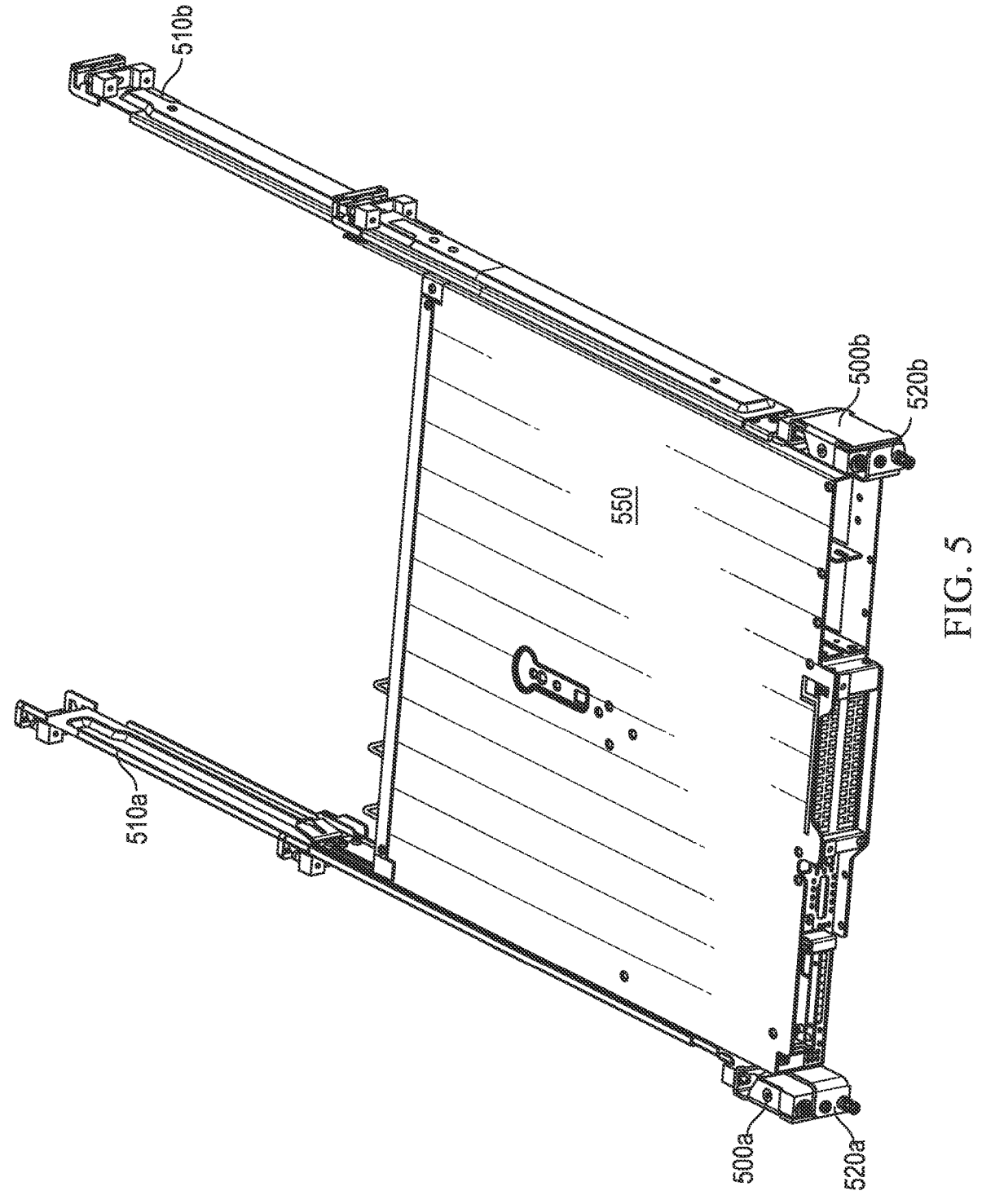
FIG. 5 is an angled top and side perspective view of the full width and depth of an IHS mounted to rack rails of a server rack, using a spacer solution and updated server ear that pushes the IHS further back in the rack, showing the full IHS and rack rails, according to some embodiments.

FIG. 5 is an angled top and side perspective view of the full width and depth of an IHS (in this case server system 550) mounted to rack rails (510a, 510b) of a server rack, using a spacer solution (500a, 500b) and updated server ears (520a, 520b) that pushes the IHS further back in the rack, showing the full IHS (server system 550) and full rack rails (510a, 510b), according to some embodiments.

Figure 6A:
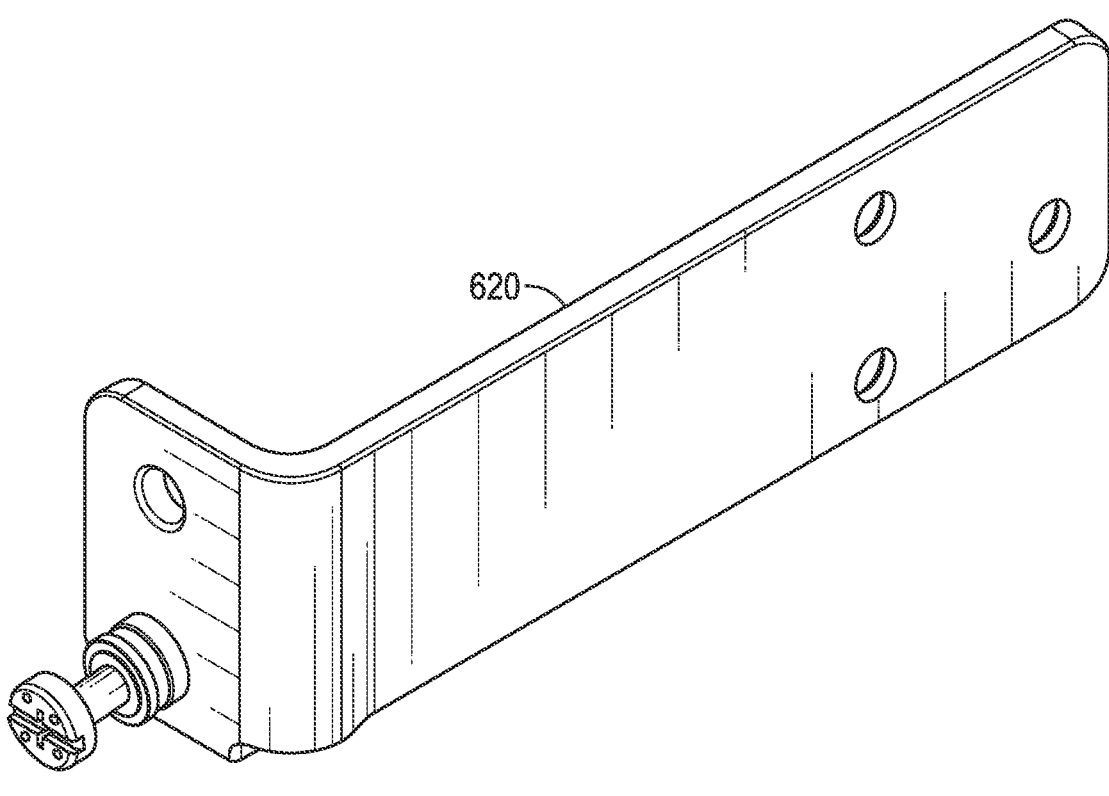
FIG. 6A depicts an updated server ear for use with the systems and methods for mounting IHSs to server racks using a spacer, according to some embodiments.

FIG. 6A depicts an updated server ear (620) for use with the systems and methods for mounting IHSs to server racks using a spacer, according to some embodiments. In FIG. 6A, the server ear 620 is elongated. The new elongated server ear 620 is connected to the server system by screws. The server system can be positioned on the rack rails, and then slid into the rack on the rack rails. Once the server system is slid into the rack, the new elongated server ear 620 can then be connected to the front of the rack by depicted screw in FIG. 6A, to lock the server system 250 in place within the rack.

Figure 6B:
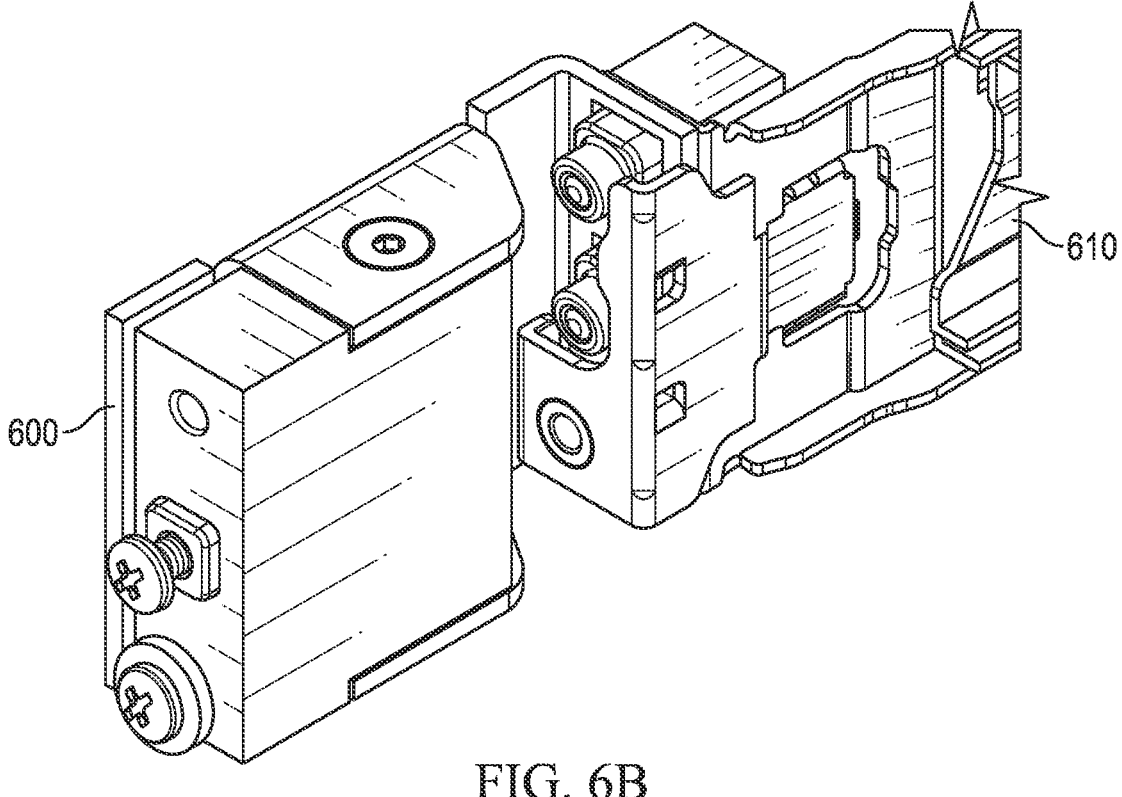
FIG. 6B depicts a spacer connected to a rack rail for use with the systems and methods for mounting IHSs to server racks using a spacer, according to some embodiments.

FIG. 6B depicts a spacer 600 connected to a rack rail 610 for use with the systems and methods for mounting IHSs to server racks using a spacer, according to some embodiments. The rack rail 610 can be secured to the new spacer 600 by a new mount flange. The new spacer 600 can then be connected to a front mounting post of the rack, by the two screws depicted in FIG. 6B, to connects the spacer 600 to the front of the rack.

Figure 6C:
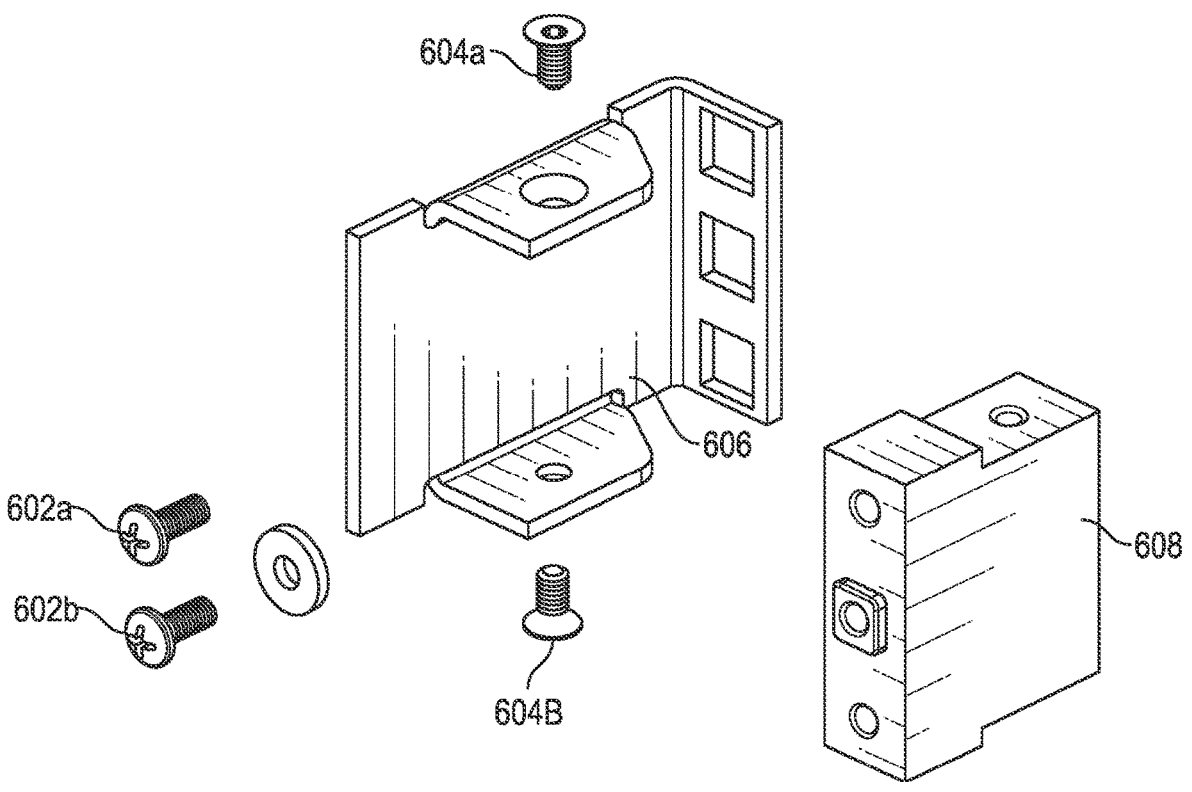
FIG. 6C is an exploded-view drawing depicting the components of the spacer of FIG. 6B, for use with the systems and methods for mounting IHSs to server racks using a spacer, according to some embodiments.

FIG. 6C is an exploded-view drawing depicting the components of the spacer 600 of FIG. 6B, for use with the systems and methods for mounting IHSs to server racks using a spacer, according to some embodiments. The spacer includes a bracket component 606 that connects to a central component 608 by two screws (604a, 604b). The bracket component 606 can connect to the rail connection component to connect the spacer to a rail. Two screws (602a, 602b) can be used to connect the spacer to a front mounting bracket of a rack, and to also connect it to the updated server ear 620.

Figure 7A:
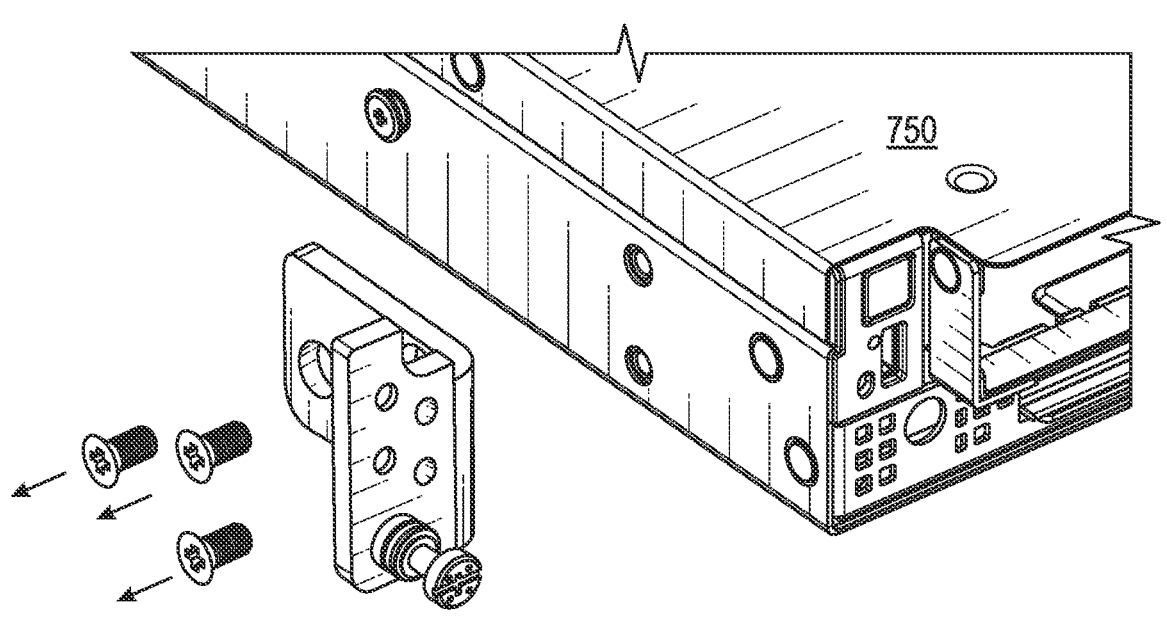
FIG. 7A depicts a first step of an installation process for mounting an IHS to a server rack using a spacer solution and updated server ear, where the original server ears are removed from both sides of the system, according to some embodiments.

FIG. 7A depicts a first step of an installation process for mounting an IHS (in this case server system 750) to a server rack using a spacer solution and updated server ear, where the original server ears 718 are removed from both sides of the system, according to some embodiments.

Figure 7B:
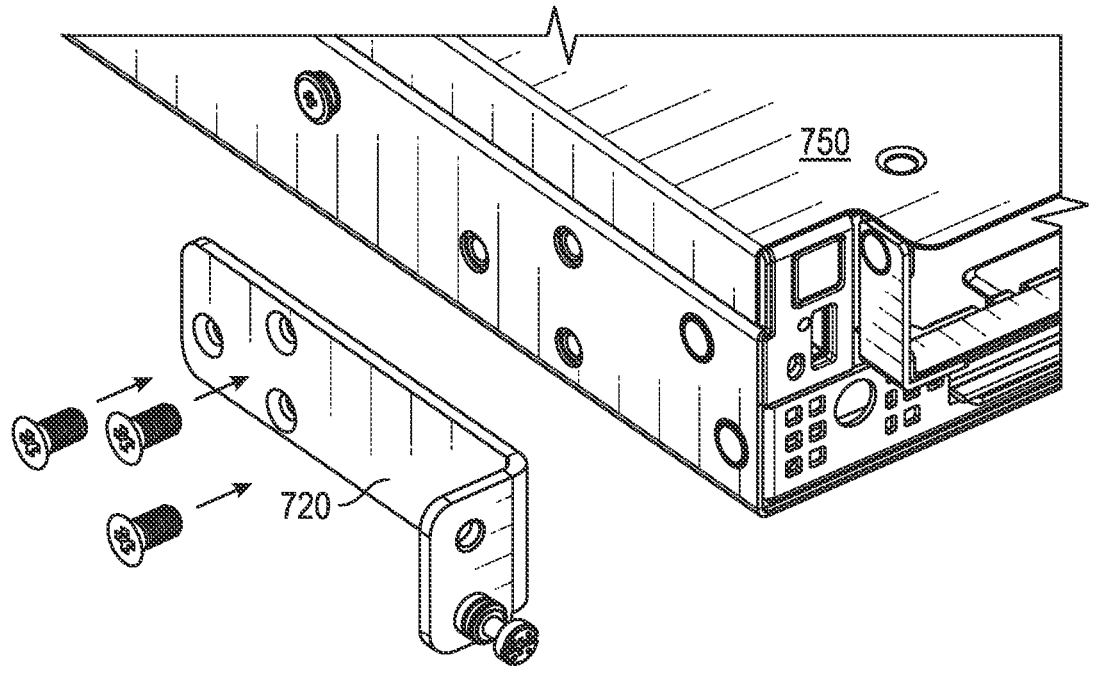
FIG. 7B depicts a second step of an installation process for mounting an IHS to a server rack using a spacer solution and updated server ear, where the new server ears are installed on both sides of the system, according to some embodiments.

FIG. 7B depicts a second step of an installation process for mounting an IHS (in this case server system 750) to a server rack using a spacer solution 700 and updated server ear 720, where the new server ears 720 are installed on both sides of the system, according to some embodiments.

Figure 7C:
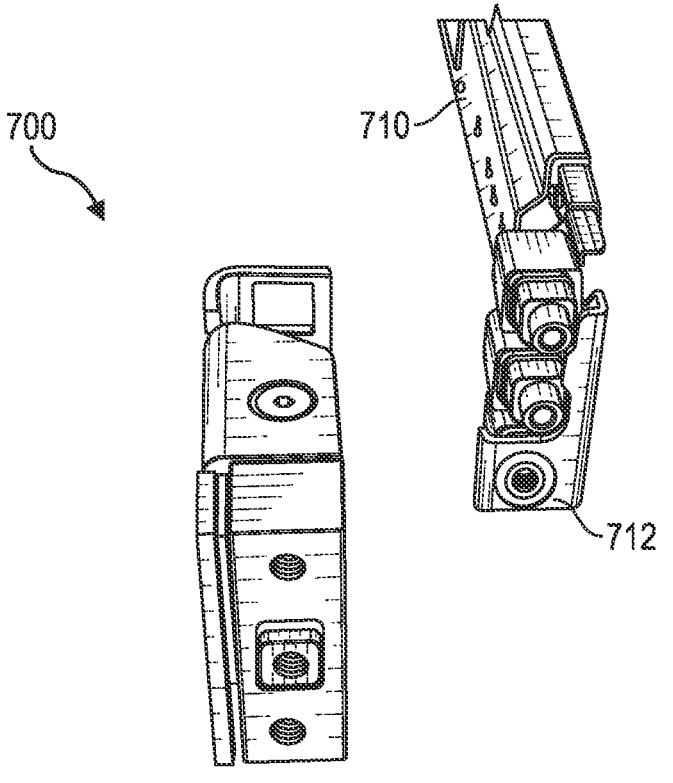
FIG. 7C depicts a third step of an installation process for mounting an IHS to a server rack using a spacer solution and updated server ear, which puts the new spacer and the rack rails in a certain orientation, according to some embodiments.

FIG. 7C depicts a third step of an installation process for mounting an IHS (in this case server system 750) to a server rack using a spacer solution 700 and updated server ear 720, which puts the new spacer 700 and the rack rails 710 in a certain orientation, according to some embodiments. The rack rail 710 includes front face plate 712. This orientation can be mirrored for the other rack rail, in some embodiments.

Figure 7D:
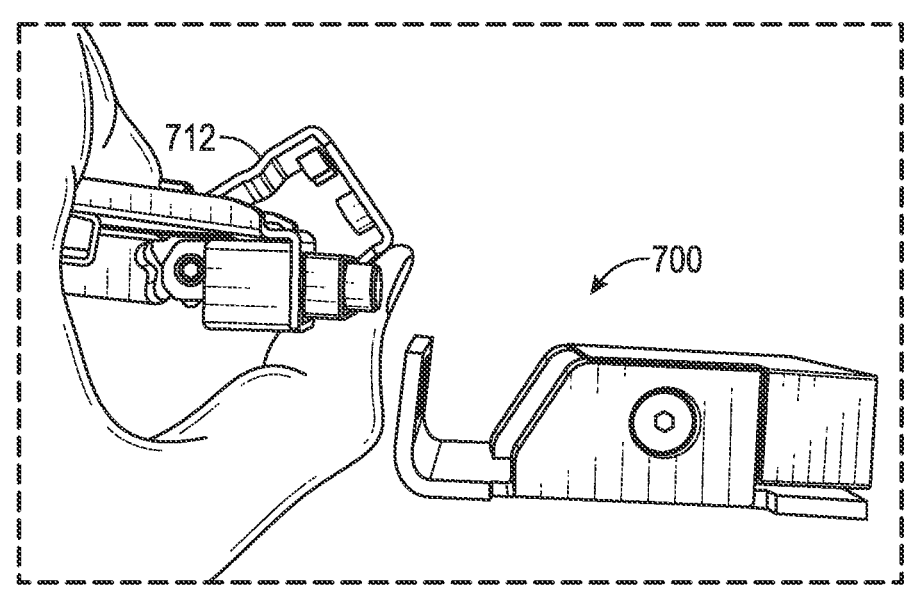
FIG. 7D depicts a fourth step of an installation process for mounting an IHS to a server rack using a spacer solution and updated server ear, where the front face plate of the rail is pushed to the side, so that the spacer can be seated and captured by the rail, according to some embodiments.

FIG. 7D depicts a fourth step of an installation process for mounting an IHS (in this case server system 750) to a server rack using a spacer solution 700 and updated server ear 720, where the front face plate 712 of the rack rail 710 is pushed to the side, so that the spacer 700 can be seated and captured by the rail 710, according to some embodiments. This allows for the spacer (700) to be captured by the rail (710).

Figure 7E:
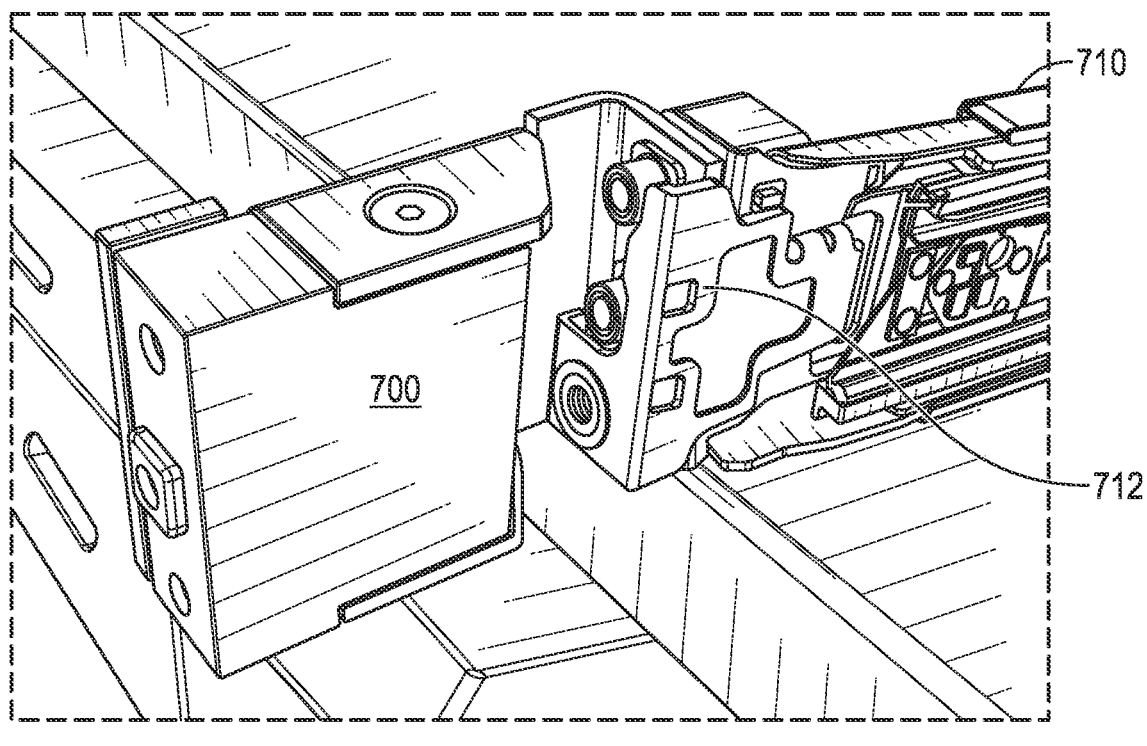
FIG. 7E depicts a fifth step of an installation process for mounting an IHS to a server rack using a spacer solution and updated server ear, where the spacer is seated on and captured by the rail, according to some embodiments.

FIG. 7E depicts a fifth step of an installation process for mounting an IHS (in this case server system 750) to a server rack using a spacer solution 700 and updated server ear 720, where the spacer 700 is seated on and captured by the rail 710 using the front face plate 712 of the rail 710, according to some embodiments.

Figure 7F:
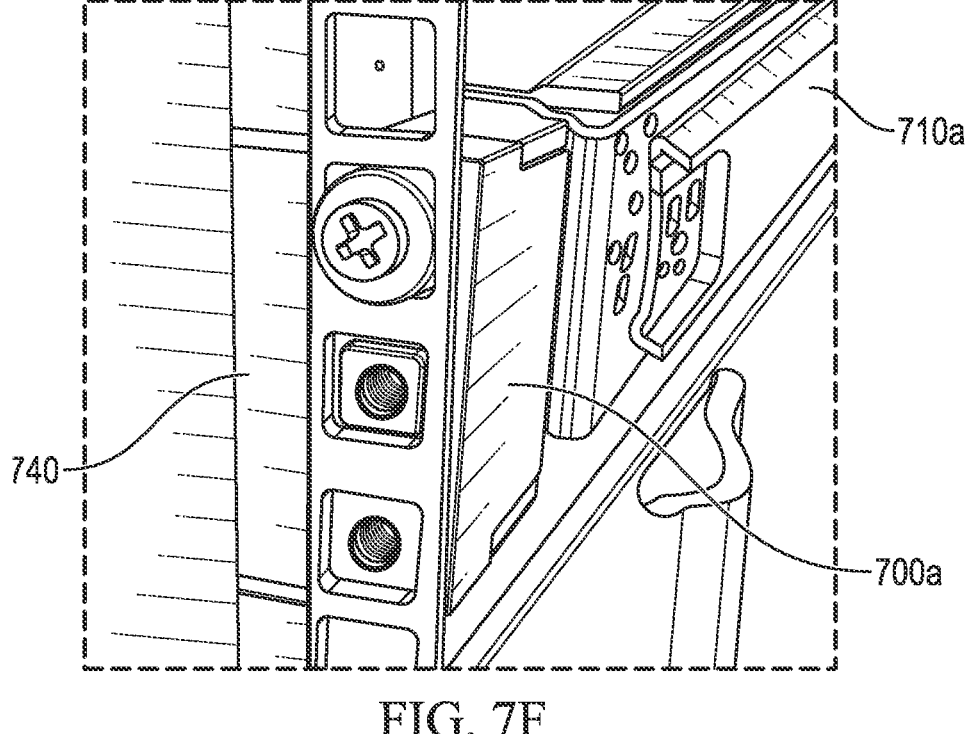
FIG. 7F depicts a sixth step of an installation process for mounting an IHS to a server rack using a spacer solution and updated server ear, where the front of the rails with the spacer solution is installed onto the rack, according to some embodiments.

FIG. 7F depicts a sixth step of an installation process for mounting an IHS (in this case server system 750) to a server rack using a spacer solution 700 and updated server ear 720, where the front of the left rail 710a with the left-side spacer solution 700a is installed onto the left-side front mounting post 740 of the rack, according to some embodiments.

Figure 7G:
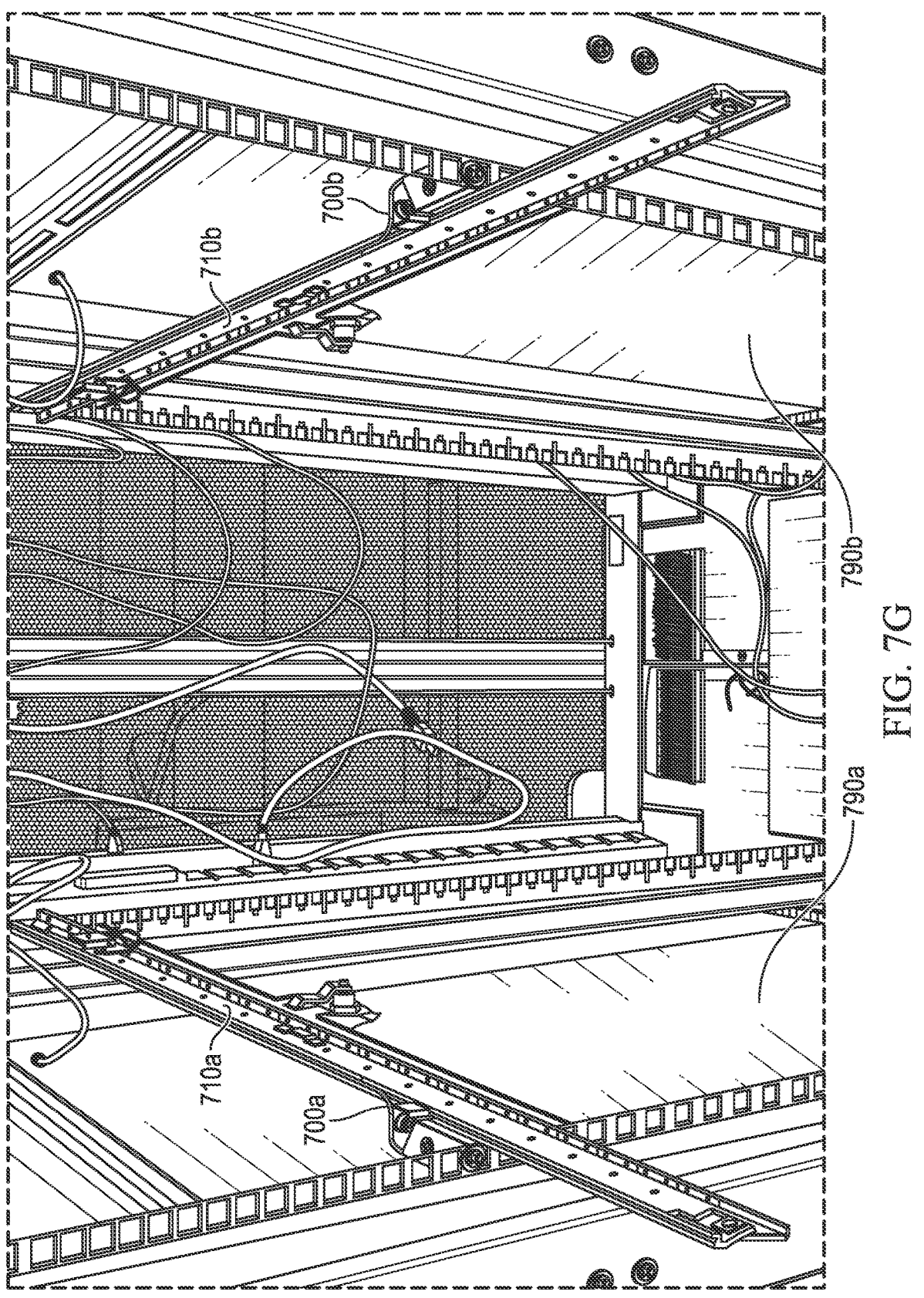
FIG. 7G depicts a seventh step of an installation process for mounting an IHS to a server rack using a spacer solution and updated server ear, where both the left and right rails, with their corresponding spacer solutions, are installed onto the rack, and the middle portion of the rails are extended into their 'service position', according to some embodiments.

FIG. 7G depicts a seventh step of an installation process for mounting an IHS (in this case server system 750) to a server rack using a spacer solution (700a. 700b) and updated server car, where both the left rail 710a and the right rail 710b, with their corresponding spacer solutions (700a, 700b), are installed onto the rack, and the middle portion of the rails are extended into their 'service position', according to some embodiments. The installed spacers (700a. 700b) do not interfere with the function of the rails (710a, 710b) or the rack walls (790a, 790b).

Figure 7H:
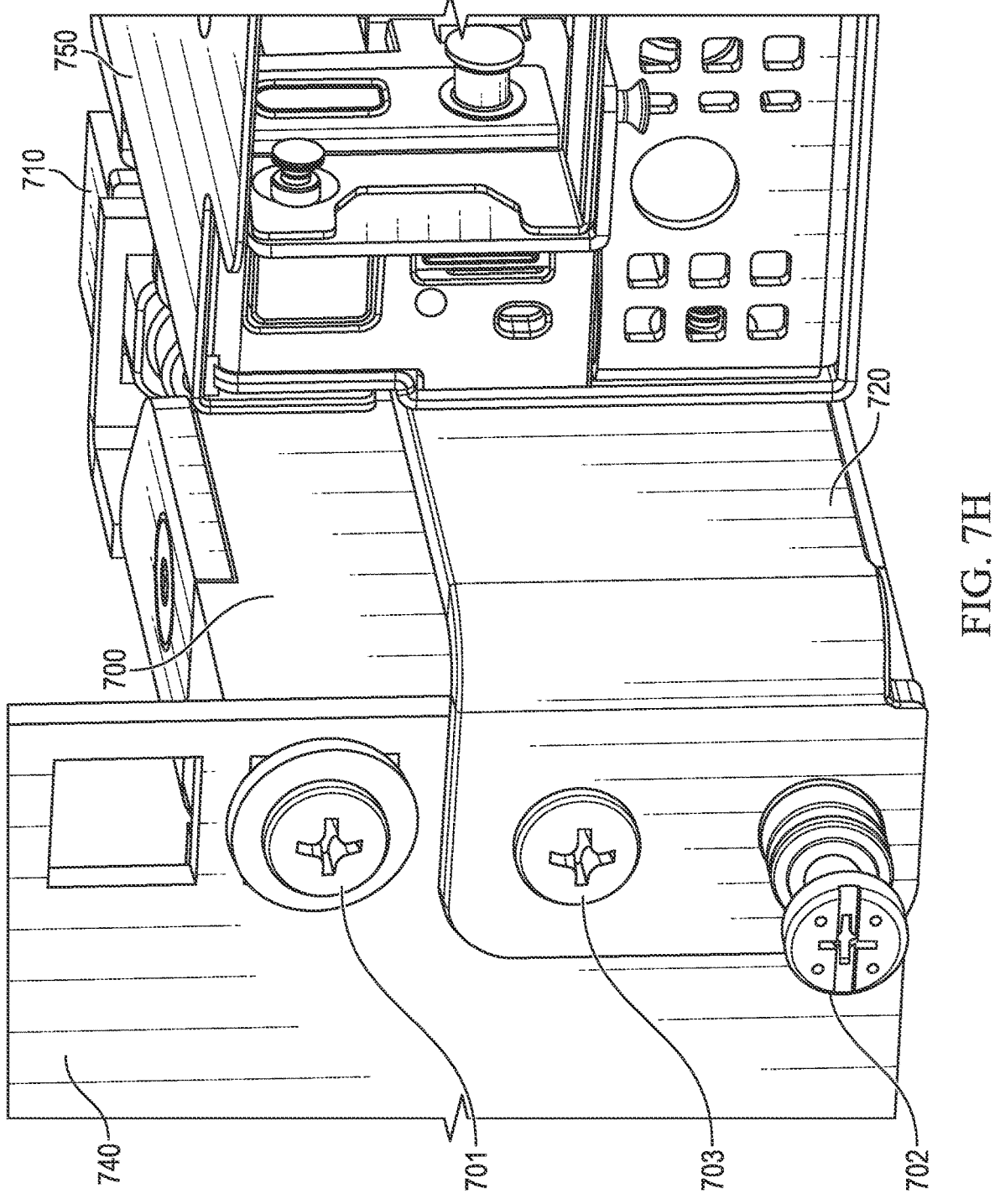
FIG. 7H depicts an eighth step of an installation process for mounting an IHS to a server rack using a spacer solution and updated server ear, where the IHS is installed and pushed into its 'working position', and where the captured screw on the server ear is secured into the spacer and the rails.

FIG. 7H depicts an eighth step of an installation process for mounting an IHS (in this case server system 750) to a server rack using a spacer solution 700 and updated server ear 720, where the server system 750 is installed and pushed into its 'working position'. First, screw 701 secures the spacer 700, along with the rail 710 the spacer is connected to, to the front-side mounting post 740 of the front of rack. The bottom screw (702) on the new server ear (720) can be secured into the spacer (700) through the front-side mounting post 740 of the front of rack. This secures the server system (750) to the rail (710). An additional screw (703) can go through the top hole of the new server ear (720), and can be threaded into the center hole of the spacer (700) through the front of rack as well, in some embodiments.

Figure 8:
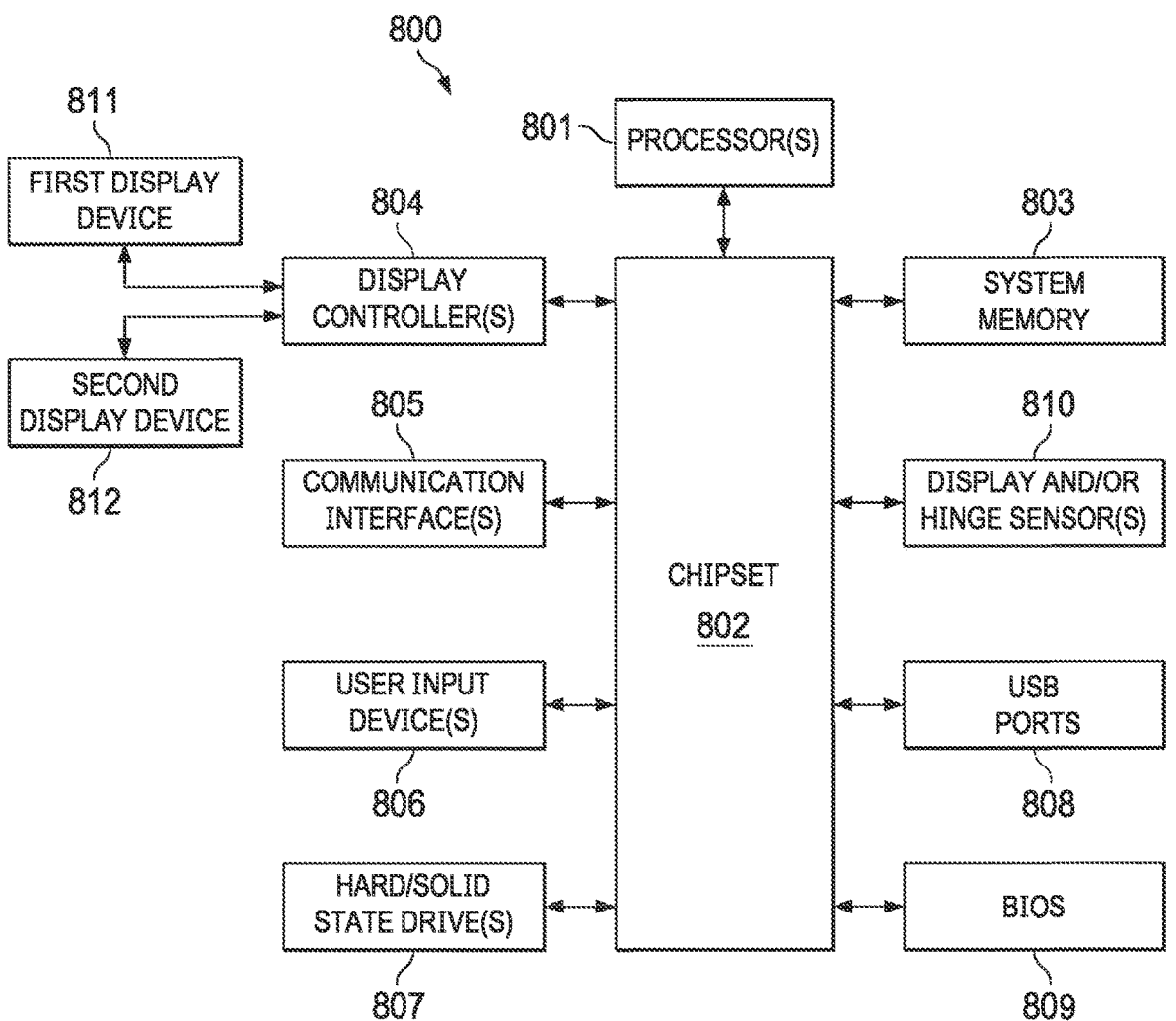
FIG. 8 is a diagram illustrating an example of environment 900 where systems and methods described herein may be implemented, according to some embodiments.

FIG. 8 is a diagram illustrating an example of environment 800 where systems and methods described herein may be implemented, according to some embodiments. As depicted, components 800 include one or more processors 801. In various embodiments, IHS 800 may be a single-processor system, or a multi-processor system including two or more processors. Processor 801 may include any processor capable of executing program instructions, such as a PENTIUM series processor, or any general-purpose or embedded processors implementing any of a variety of Instruction Set Architectures (ISAs), such as an x86 ISA or a Reduced Instruction Set Computer (RISC) ISA (e.g., POWERPC, ARM, SPARC, MIPS, etc.).

IHS 800 includes chipset 802 coupled to processor 801. In certain embodiments, chipset 802 may utilize a QuickPath Interconnect (QPI) bus to communicate with processor 801. In various embodiments, chipset 802 may provide processor 801 with access to a number of resources. Moreover, chipset 802 may be coupled to communication interface(s) 805 to enable communications via various wired and/or wireless networks, such as Ethernet, WiFi, BLUETOOTH, cellular or mobile networks (e.g., CDMA, TDMA, LTE, etc.), satellite networks, or the like. Communication interface(s) 805 may also be used to communicate with certain peripherals devices (e.g., BT speakers, microphones, headsets, etc.). Moreover, communication interface(s) 805 may be coupled to chipset 802 via a Peripheral Component Interconnect Express (PCIe) bus, or the like.

Chipset 802 may be coupled to display controller(s) 804, which may include one or more or graphics processor(s) (GPUs) on a graphics bus, such as an Accelerated Graphics Port (AGP) or Peripheral Component Interconnect Express (PCIe) bus. As shown, display controller(s) 804 provides video or display signals to one or more display devices, such as a first display device 811 and second display device 802. In other implementations, any number of display controller(s) 804 and/or display devices 811/812 may be used.

Each of display devices 811 and 812 may include a flexible display that is deformable (e.g., bent, folded, rolled, or stretched) by an external force applied thereto. For example, display devices 811 and 812 may include Liquid Crystal Display (LCD), Light Emitting Diode (LED), organic LED (OLED), AMOLED, plasma, electrophoretic, or electrowetting panel(s) or film(s). Each display device 811 and 812 may include a plurality of pixels arranged in a matrix, configured to display visual information, such as text, two-dimensional images, video, three-dimensional images, etc.

Display device(s) 811/812 may be configured to sense haptic and/or physical touch events, and to generate touch information. To this end, display device(s) 811/812 may include a touchscreen matrix (e.g., a layered capacitive panel or the like) and/or touch controller configured to receive and interpret multi-touch gestures from a user touching the screen with a stylus or one or more fingers. In some cases, display and touch control aspects of display device(s) 811/812 may be collectively operated and controlled by display controller(s) 804.

In some cases, display device(s) 811/812 may also include a deformation or bending sensor configured to generate deformation or bending information including, but not limited to: the bending position of a display (e.g., in the form of a "bending line" connecting two or more positions at which bending is detected on the display), bending direction, bending angle, bending speed, etc. In these implementations, display device(s) 811/812 may be provided as a single continuous display, rather than two discrete displays.

Chipset 802 may also provide processor 801 and/or display controller(s) 804 with access to memory 803. In various embodiments, system memory 803 may be implemented using any suitable memory technology, such as static RAM (SRAM), dynamic RAM (DRAM) or magnetic disks, or any nonvolatile/Flash-type memory, such as a solid-state drive (SSD) or the like. Memory 803 may store program instructions that, upon execution by processor 801 and/or controller(s) 804, present a UI interface to a user of IHS 800.

Chipset 802 may further provide access to one or more hard disk and/or solid-state drives, optical drives, or other removable-media drives 807. In certain embodiments, chipset 802 may also provide access to one or more optical drives or other removable-media drives. In certain embodiments, chipset 802 may also provide access to one or more Universal Serial Bus (USB) ports 808, to which one or more peripheral devices may be coupled (e.g., integrated or external webcams, microphones, speakers, etc.). The USB ports 808 may use one or more embodiments of the USB connector assemblies described in the present disclosure.

Upon booting of IHS 800, processor(s) 801 may utilize Basic Input/Output System (BIOS) 809 instructions to initialize and test hardware components coupled to IHS 800 and to load an Operating System (OS) for use by IHS 800. BIOS 809 provides an abstraction layer that allows the OS to interface with certain hardware components that are utilized by IHS 800. Via the hardware abstraction layer provided by BIOS 809, software stored in memory 803 and executed by the processor(s) 801 of IHS 800 is able to interface with certain I/O devices that are coupled to the IHS 800. The Unified Extensible Firmware Interface (UEFI) was designed as a successor to BIOS. As a result, many modern IHSs utilize UEFI in addition to or instead of a BIOS. As used herein, BIOS is intended to also encompass UEFI.

Chipset 802 may also provide access to one or more user input devices 806, for example, using a super I/O controller or the like. For instance, chipset 802 may provide access to a keyboard (e.g., keyboard 103), mouse, trackpad, stylus, totem, or any other peripheral input device, including touchscreen displays 811 and 812. These input devices may interface with chipset 802 through wired connections (e.g., in the case of touch inputs received via display controller(s) 804) or wireless connections (e.g., via communication interfaces(s) 805). In some cases, chipset 802 may be used to interface with user input devices such as keypads, biometric scanning devices, and voice or optical recognition devices.

Each of user input devices 806 may include a respective controller (e.g., a touchpad may have its own touchpad controller) that interfaces with chipset 802 through a wired or wireless connection (e.g., via communication interfaces(s) 805). In some cases, chipset 802 may also provide access to one or more user output devices (e.g., video projectors, paper printers, 3D printers, loudspeakers, audio headsets, Virtual/Augmented Reality (VR/AR) devices, etc.)

In certain embodiments, chipset 802 may also provide an interface for communications with one or more hardware sensors 810. Sensors 810 may be disposed within displays 811/812 and/or display controllers 804, and may include, but are not limited to: electric, magnetic, radio, optical, infrared, thermal, force, pressure, acoustic, ultrasonic, proximity, position, deformation, bending, direction, movement, velocity, rotation, and/or acceleration sensor(s).

An embedded Controller (EC) or Baseboard Management Controller (BMC) can be operational from the very start of each IHS power reset and handles various tasks not ordinarily handled by host processor(s) 201. Examples of these operations may include, but are not limited to: receiving and processing signals from a keyboard or touchpad, as well as other buttons and switches (e.g., power button, laptop lid switch, etc.), receiving and processing thermal measurements (e.g., performing fan control, CPU and GPU throttling, and emergency shutdown), controlling indicator LEDs (e.g., caps lock, scroll lock, num lock, battery, ac, power, wireless LAN, sleep, etc.), managing PMU/BMU, alternating current (AC) adapter/Power Supply Unit (PSU) and/or battery, allowing remote diagnostics and remediation over network(s), etc.

For example, EC/BMC may implement operations for interfacing with power adapter/PSU in managing power for IHS 800. Such operations may be performed to determine the power status of IHS 800, such as whether IHS 800 is operating from AC adapter/PSU and/or battery.

Firmware instructions utilized by EC/BMC may also be used to provide various core operations of IHS 800, such as power management and management of certain modes of IHS 800 (e.g., turbo modes, maximum operating clock frequencies of certain components, etc.).

In addition, EC/BMC may implement operations for detecting certain changes to the physical configuration or posture of IHS 800. For instance, when IHS 800 as a 2-in-1 laptop/tablet form factor, EC/BMC may receive inputs from a lid position or hinge angle sensor 810, and it may use those inputs to determine: whether the two sides of IHS 800 have been latched together to a closed position or a tablet position, the magnitude of a hinge or lid angle, etc. In response to these changes, the EC may enable or disable certain features of IHS 800 (e.g., front or rear facing camera, etc.).

In some cases, EC/BMC may be configured to identify any number of IHS postures, including, but not limited to: laptop, stand, tablet, tent, or book. For example, when display(s) 811/812 of IHS 800 is open with respect to a horizontal keyboard portion, and the keyboard is facing up, EC/BMC may determine IHS 800 to be in a laptop posture. When display(s) 811/812 of IHS 800 is open with respect to the horizontal keyboard portion, but the keyboard is facing down (e.g., its keys are against the top surface of a table), EC/BMC may determine IHS 800 to be in a stand posture.

When the back of display(s) is closed against the back of the keyboard portion, EC/BMC may determine IHS 800 to be in a tablet posture. When IHS 800 has two display(s) 811/812 open side-by-side, EC/BMC may determine IHS 800 to be in a book posture. When IHS 800 has two displays open to form a triangular structure sitting on a horizontal surface, such that a hinge between the displays is at the top vertex of the triangle, EC/BMC may determine IHS 800 to be in a tent posture. In some implementations, EC/BMC may also determine if display(s) 811/812 of IHS 800 are in a landscape or portrait orientation.

In some cases, an EC/BMC may be installed as a Trusted Execution Environment (TEE) component to the motherboard of IHS 800.

Additionally, or alternatively, EC/BMC may be configured to calculate hashes or signatures that uniquely identify individual components of IHS 800. In such scenarios, EC/BMC may calculate a hash value based on the configuration of a hardware and/or software component coupled to IHS 800. For instance, EC/BMC may calculate a hash value based on all firmware and other code or settings stored in an onboard memory of a hardware component.

Hash values may be calculated as part of a trusted process of manufacturing IHS 200 and may be maintained in secure storage as a reference signature. EC/BMC may later recalculate the hash value for a component may compare it against the reference hash value to determine if any modifications have been made to the component, thus indicating that the component has been compromised. In this manner, EC/BMC may validate the integrity of hardware and software components installed in IHS 800.

In various embodiments, IHS 800 may be coupled to an external power source (e.g., AC outlet or mains) through AC adapter/PSU. AC adapter/PSU may include an adapter portion having a central unit (e.g., a power brick, wall charger, or the like) configured to draw power from an AC outlet via a first electrical cord, convert the AC power to direct current (DC) power, and provide DC power to IHS 800 via a second electrical cord.

Additionally, or alternatively, AC adapter/PSU may include an internal or external power supply portion (e.g., a switching power supply, etc.) connected to the second electrical cord and configured to convert AC to DC. AC adapter/PSU may also supply a standby voltage, so that most of IHS 800 can be powered off after preparing for hibernation or shutdown, and powered back on by an event (e.g., remotely via wake-on-LAN, etc.). In general, AC adapter/PSU may have any specific power rating, measured in volts or watts, and any suitable connectors.

IHS 800 may also include internal or external battery. Battery may include, for example, a Lithium-ion or Li-ion rechargeable device capable of storing energy sufficient to power IHS 800 for an amount of time, depending upon the IHS's workloads, environmental conditions, etc. In some cases, a battery pack may also contain temperature sensors, voltage regulator circuits, voltage taps, and/or charge-state monitors.

A power Management Unit (PMU) can governs power functions of IHS 800, including AC adapter/PSU and battery. For example, PMU may be configured to: monitor power connections and battery charges, charge battery, control power to other components, devices, or ICs, shut down components when they are left idle, control sleep and power functions ("on" and "off"), manage interfaces for built-in keypad and touchpads, regulate real-time clocks (RTCs), etc.

In some implementations, PMU may include one or more Power Management Integrated Circuits (PMICs) configured to control the flow and direction or electrical power in IHS 800. Particularly, a PMIC may be configured to perform battery management, power source selection, voltage regulation, voltage supervision, undervoltage protection, power sequencing, and/or charging operations. It may also include a DC-to-DC converter to allow dynamic voltage scaling, or the like.

Additionally, or alternatively, PMU may include a Battery Management Unit (BMU) (referred to collectively as "PMU/BMU"). AC adapter/PSU may be removably coupled to a battery charge controller within PMU/BMU to provide IHS 800 with a source of DC power from battery cells within battery (e.g., a lithium ion (Li-ion) or nickel metal hydride (NiMH) battery pack including one or more rechargeable batteries). PMU/BMU may include non-volatile memory and it may be configured to collect and store battery status, charging, and discharging information, and to provide that information to other IHS components.

Examples of information collected and stored in a memory within PMU/BMU may include, but are not limited to: operating conditions (e.g., battery operating conditions including battery state information such as battery current amplitude and/or current direction, battery voltage, battery charge cycles, battery state of charge, battery state of health, battery temperature, battery usage data such as charging and discharging data; and/or IHS operating conditions such as processor operating speed data, system power management and cooling system settings, state of "system present" pin signal), environmental or contextual information (e.g., such as ambient temperature, relative humidity, system geolocation measured by GPS or triangulation, time and date, etc.), and BMU events.

Examples of BMU events may include, but are not limited to: acceleration or shock events, system transportation events, exposure to elevated temperature for extended time periods, high discharge current rate, combinations of battery voltage, battery current and/or battery temperature (e.g., elevated temperature event at full charge and/or high voltage causes more battery degradation than lower voltage), etc.

In some embodiments, power draw measurements may be conducted with control and monitoring of power supply via PMU/BMU. Power draw data may also be monitored with respect to individual components or devices of IHS 800. Whenever applicable, PMU/BMU may administer the execution of a power policy, or the like.

IHS 800 may also include one or more fans configured to cool down one or more components or devices of IHS 800 disposed inside a chassis, case, or housing. Fan(s) may include any fan inside, or attached to, IHS 800 and used for active cooling. Fan(s) may be used to draw cooler air into the case from the outside, expel warm air from inside, and/or move air across a heat sink to cool a particular IHS component. In various embodiments, both axial and sometimes centrifugal (blower/squirrel-cage) fans may be used.

In other embodiments, IHS 800 may not include all the components shown in FIG. 8. In other embodiments, IHS 800 may include other components in addition to those that are shown in FIG. 8. Furthermore, some components that are represented as separate components in FIG. 8 may instead be integrated with other components, such that all or a portion of the operations executed by the illustrated components may instead be executed by the integrated component.

For example, in various embodiments described herein, host processor(s) 801 and/or other components of IHS 800 (e.g., chipset 802, display/touch controller(s) 804, communication interface(s) 805, EC/BMC, etc.) may be replaced by discrete devices within a heterogenous computing platform (e.g., a System-On-Chip or "SoC"). As such, IHS 800 may assume different form factors including, but not limited to: servers, workstations, desktops, laptops, appliances, video game consoles, tablets, smartphones, etc.

To implement various operations described herein, computer program code (i.e., program instructions for carrying out these operations) may be written in any combination of one or more programming languages, including an object-oriented programming language such as Java, Smalltalk, Python, C++, or the like, conventional procedural programming languages, such as the "C" programming language or similar programming languages, or any of machine learning software. These program instructions may also be stored in a computer readable storage medium that can direct a computer system, other programmable data processing apparatus, controller, or other device to operate in a particular manner, such that the instructions stored in the computer readable medium produce an article of manufacture including instructions which implement the operations specified in the block diagram block or blocks.

Program instructions may also be loaded onto a computer, other programmable data processing apparatus, controller, or other device to cause a series of operations to be performed on the computer, or other programmable apparatus or devices, to produce a computer implemented process such that the instructions upon execution provide processes for implementing the operations specified in the block diagram block or blocks.

Modules implemented in software for execution by various types of processors may, for instance, include one or more physical or logical blocks of computer instructions, which may, for instance, be organized as an object or procedure. Nevertheless, the executables of an identified module need not be physically located together but may include disparate instructions stored in different locations which, when joined logically together, include the module and achieve the stated purpose for the module. Indeed, a module of executable code may be a single instruction, or many instructions, and may even be distributed over several different code segments, among different programs, and across several memory devices.

Similarly, operational data may be identified and illustrated herein within modules and may be embodied in any suitable form and organized within any suitable type of data structure. Operational data may be collected as a single data set or may be distributed over different locations including over different storage devices.

Reference is made herein to "configuring" a device or a device "configured to" perform some operation(s). This may include selecting predefined logic blocks and logically associating them. It may also include programming computer software-based logic of a retrofit control device, wiring discrete hardware components, or a combination of thereof. Such configured devices are physically designed to perform the specified operation(s).

Various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs.

As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

Although the invention(s) is/are described herein with reference to specific embodiments, various modifications and changes can be made without departing from the scope of the present invention(s), as set forth in the claims below.

Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

The invention claimed is:

1. A spacer assembly, comprising:
a mounting flange configured to removably couple to a rail of a server rack; and
a connector configured to couple to a mounting post of the server rack;
wherein the spacer assembly is configured to couple to the rail of the server rack by:
pushing a front face plate of the rail aside;
seating the spacer assembly onto the rail;
closing the front face plate of the rail; and
capturing the spacer assembly by the closing of the front face plate of the rail.

2. The spacer assembly of claim 1, further comprising:
an elongated server ear separate from an Information Handling System (IHS) and configured to couple to the IHS, wherein the elongated server ear comprises a flange configured to couple to the connector and the mounting post of the server rack.

3. The spacer assembly of claim 2, wherein the IHS is a server system.

4. The spacer assembly of claim 3, wherein the server system comprises a front-accessed reverse-airflow (RAF) chassis.

5. The spacer assembly of claim 2, wherein the connector is further configured to couple to the mounting post of the server rack using one or more screws.

6. The spacer assembly of claim 5, wherein the connector is further configured to couple to the elongated server ear using the one or more screws to fully secure the IHS in the rack.

7. The spacer assembly of claim 1, wherein the spacer assembly mounts the rail of the server rack further back into the server rack.

8. The spacer assembly of claim 1, wherein the mounting post is a front-side mounting post of the server rack, and wherein the rail is further coupled to a back-side mounting post of the server rack.

9. A method, comprising:
coupling a spacer assembly to a rail of a server rack, wherein the coupling of the spacer assembly to the rail of the server rack comprises:
pushing a front face plate of the rail aside;
seating the spacer assembly onto the rail;
closing the front face plate of the rail; and
capturing the spacer assembly by the closing of the front face plate of the rail;
and coupling the spacer assembly to a mounting post of the server rack.

10. The method of claim 9, further comprising:
coupling one or more elongated server ears to an information handling system (IHS); and
sliding the IHS into the rail of the server rack.

11. A method, comprising:
coupling a spacer assembly to a rail of a server rack;
coupling the spacer assembly to a mounting post of the server rack;
coupling one or more elongated server ears to an Information Handling System (IHS); and
sliding the IHS into the rail of the server rack;
wherein prior to coupling the one or more elongated server ears to the IHS, the method further comprises;
removing one or more original server ears from the IHS, wherein the original server ears are shorter than the elongated server ear.

12. The method of claim 11, further comprising:
coupling the elongated server ears to the mounting post of the server rack and to the spacer assembly.

13. The method of claim 11, wherein the IHS is a server system.

14. The method of claim 11, wherein the spacer assembly is coupled to the mounting post of the server rack using one or more screws.

15. The method of claim 11, wherein the spacer assembly is coupled to a front-side mounting post of the server rack, the method further comprising:
coupling a back of the rail to a back-side mounting post of the server rack.

* * * * *